(12) United States Patent
Kim

(10) Patent No.: US 9,543,031 B2
(45) Date of Patent: Jan. 10, 2017

(54) SEMICONDUCTOR DEVICE TO IMPROVE RELIABILITY OF READ OPERATION FOR MEMORY CELLS

(71) Applicant: SK hynix Inc., Gyeonggi-do (KR)

(72) Inventor: Woo Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/818,783

(22) Filed: Aug. 5, 2015

(65) Prior Publication Data

US 2016/0260493 A1  Sep. 8, 2016

(30) Foreign Application Priority Data

Mar. 4, 2015  (KR) .................. 10-2015-0030456

(51) Int. Cl.
*G11C 11/00* (2006.01)
*G11C 11/34* (2006.01)
*G11C 16/28* (2006.01)

(52) U.S. Cl.
CPC .................................. *G11C 16/28* (2013.01)

(58) Field of Classification Search
None
See application file for complete search history.

(56) References Cited

U.S. PATENT DOCUMENTS

| 8,516,183 | B2 * | 8/2013 | Eun | G11C 11/5642 |
| | | | | 365/185.03 |
| 9,007,839 | B2 * | 4/2015 | Lee | G11C 16/26 |
| | | | | 365/158 |
| 2010/0322007 | A1 * | 12/2010 | Jeon | G11C 16/20 |
| | | | | 365/185.18 |

FOREIGN PATENT DOCUMENTS

KR   1020140091955   7/2014

* cited by examiner

*Primary Examiner* — Son Dinh
*Assistant Examiner* — Sultana Begum
(74) *Attorney, Agent, or Firm* — IP & T Group LLP

(57) ABSTRACT

A semiconductor device includes memory cells; an operation circuit suitable for performing a read operation on the memory cells; and a check circuit suitable for comparing the number of memory cells of which threshold voltages are divided by the read operation, wherein the operation circuit changes a read voltage to be applied to the memory cells in the read operation, based on a result of the comparison.

15 Claims, 8 Drawing Sheets

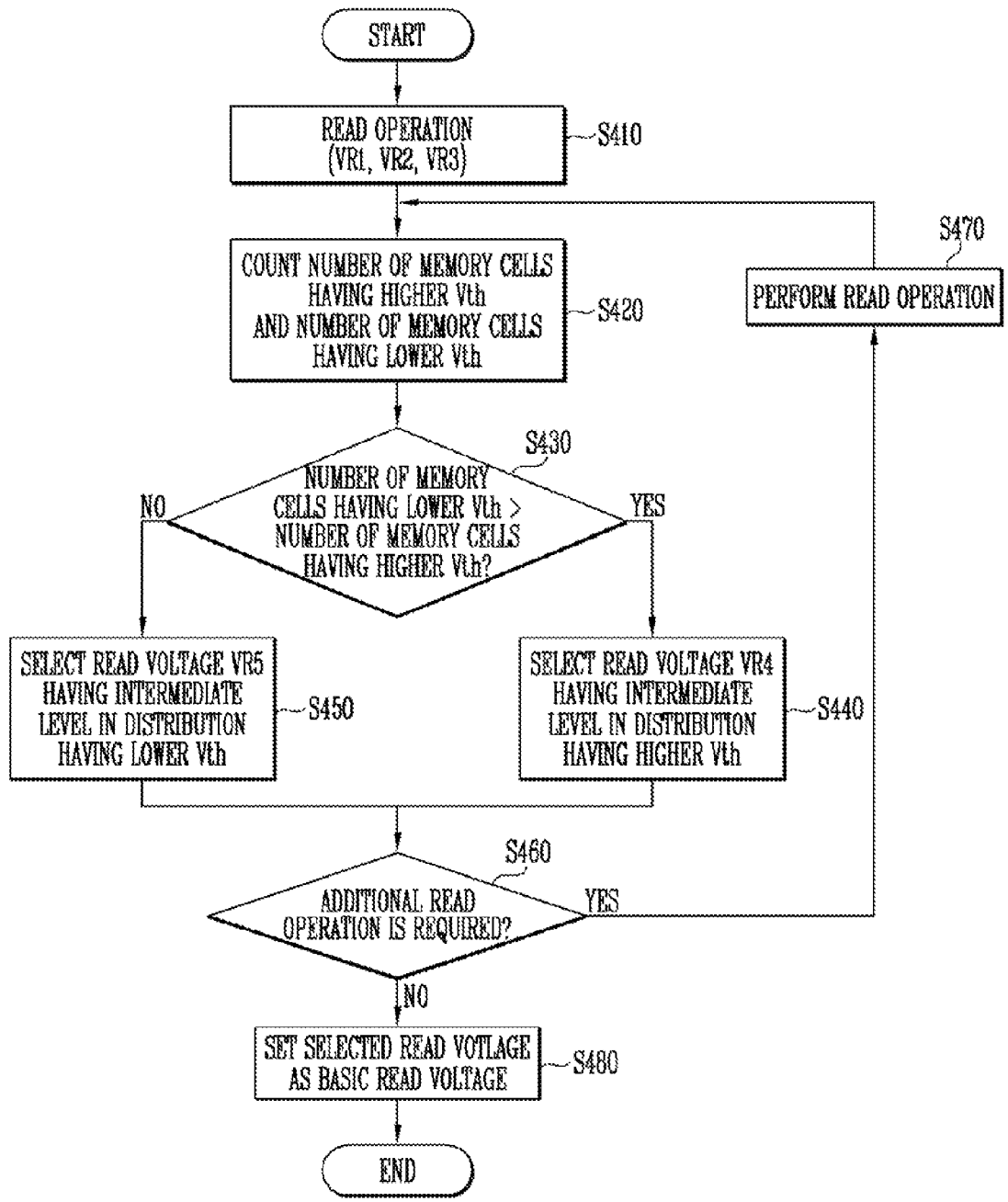

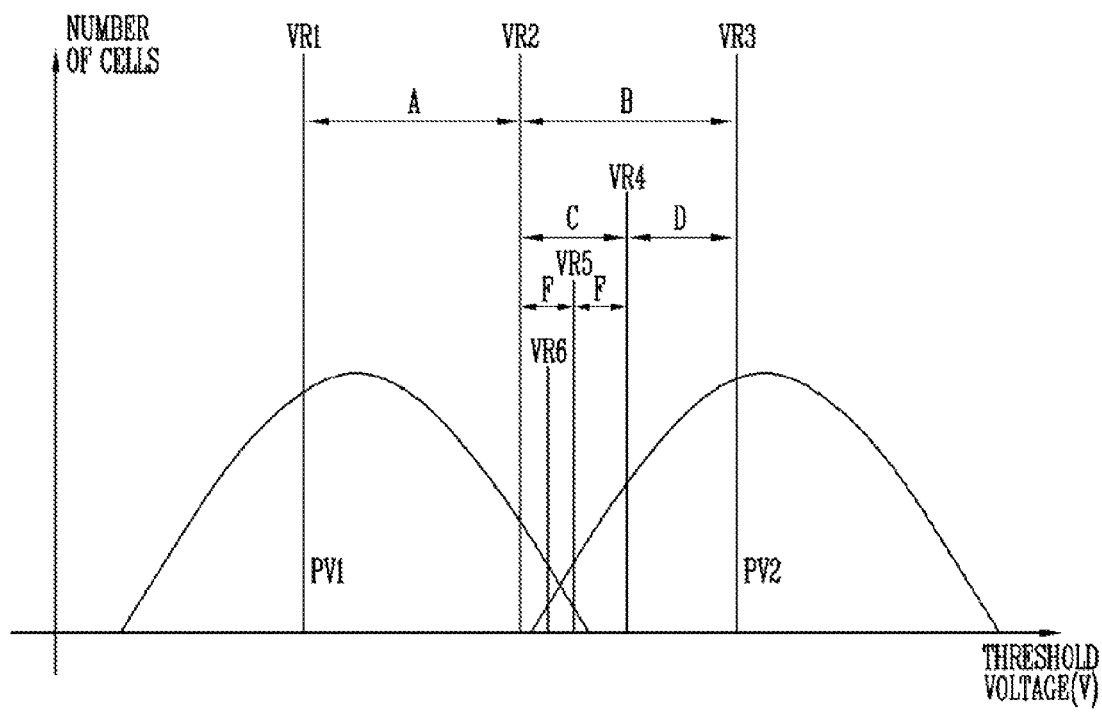

SEMICONDUCTOR DEVICE TO IMPROVE RELIABILITY OF READ OPERATION FOR MEMORY CELLS

CROSS-REFERENCE TO RELATED APPLICATION

The present application claims priority to Korean patent application number 10-2015-0030456 filed on Mar. 4, 2015, in the Korean Intellectual Property Office, the entire disclosure of which is incorporated by reference.

BACKGROUND

1. Field

Various embodiments of the present invention relate to a semiconductor device, and more particularly, to a semiconductor device including memory cells.

2. Discussion of Related Art

A read operation is performed to read data stored in memory cells of a semiconductor device. When the threshold voltage distribution of the memory cells changes, the number of error bits included in the data read from the memory cells increases. Therefore, the read voltage applied to the memory cells during read operations needs to be changed.

SUMMARY

Various embodiments of the present invention are directed to a semiconductor device capable of decreasing errors.

An embodiment of the present invention includes an operation method of operating a semiconductor device, including: memory cells; an operation circuit configured to perform a read operation of the memory cells; and a check circuit configured to compare the numbers of memory cells of which threshold voltages are divided by the read operation, in which the operation circuit changes a read voltage to be applied to the memory cells in the read operation, based on a result of the comparison.

An embodiment of the present invention provides an operation method a semiconductor device, including: memory cells; an operation circuit configured to perform a read operation of dividing a selected cell distribution into two cell distributions by performing a read operation to confirm memory cells included in each cell distribution; and a check circuit configured to perform an operation of comparing the number of memory cells included in the respective cell distributions, in which the operation circuit selects one cell distribution between the two cell distributions and re-performs the read operation based on a result of the comparison.

The foregoing summary is illustrative only and is not intended to be limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which:

FIG. 4 is a flowchart for describing an operation of the semiconductor device shown in FIG. 1;

FIG. 5 is a distribution diagram for describing an operation of the semiconductor device shown in FIG. 1;

DETAILED DESCRIPTION

Hereinafter, exemplary embodiments of the present invention will be described in detail with reference to the accompanying drawings. However, the scope of the present invention is not limited to the disclosed exemplary embodiments, but may be implemented in different forms.

Rather, the exemplary embodiments are provided for a complete disclosure of the present invention and to fully inform the scope of the invention to those skilled in the art.

It is also noted that in this specification, "connected/coupled" refers to one component not only directly coupling another component but also indirectly coupling another component through an intermediate component. In addition, a singular form may include a plural form as long as it is not specifically mentioned.

Figure 1:
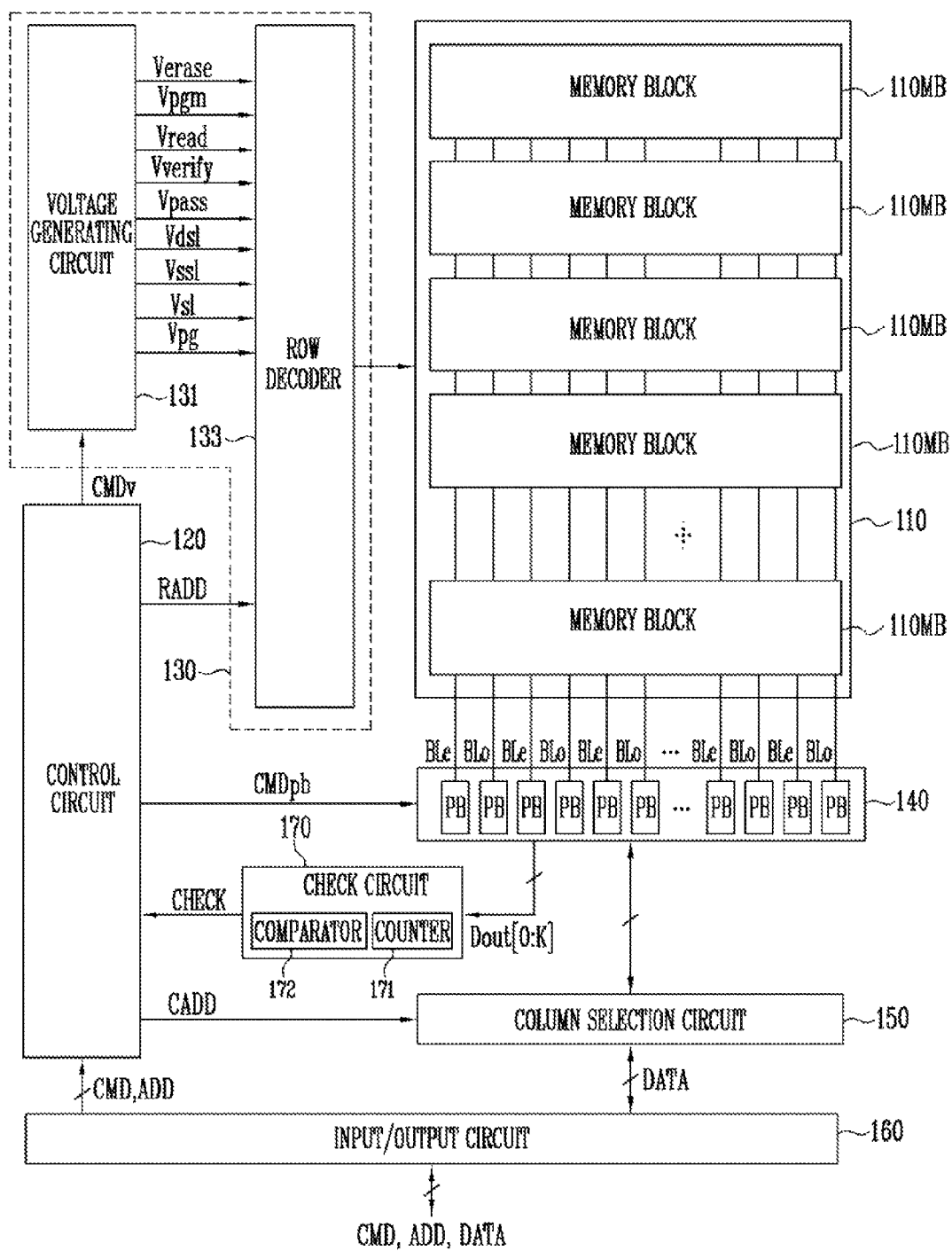
FIG. 1 is a block diagram illustrating a semiconductor device according to an embodiment of the present invention.

FIG. 1 is a block diagram illustrating a semiconductor device according to an embodiment of the present invention.

Referring to FIG. 1, a semiconductor device includes a memory array 110, operation circuits 120 to 160, and a check circuit 170. The memory array 110 includes a plurality of memory blocks 110 MB. Each of the memory blocks includes a plurality of memory strings. Each of the memory strings includes a plurality of memory cells. For a flash memory device, the memory block includes flash memory cells.

Particularly, the memory block may include memory strings connected with bit lines, respectively, and connected to a common source line in parallel. The memory strings may be formed in a 2D structure or a 3D structure on a semiconductor substrate. The structure of the memory block will be described in more detail.

Figure 2:
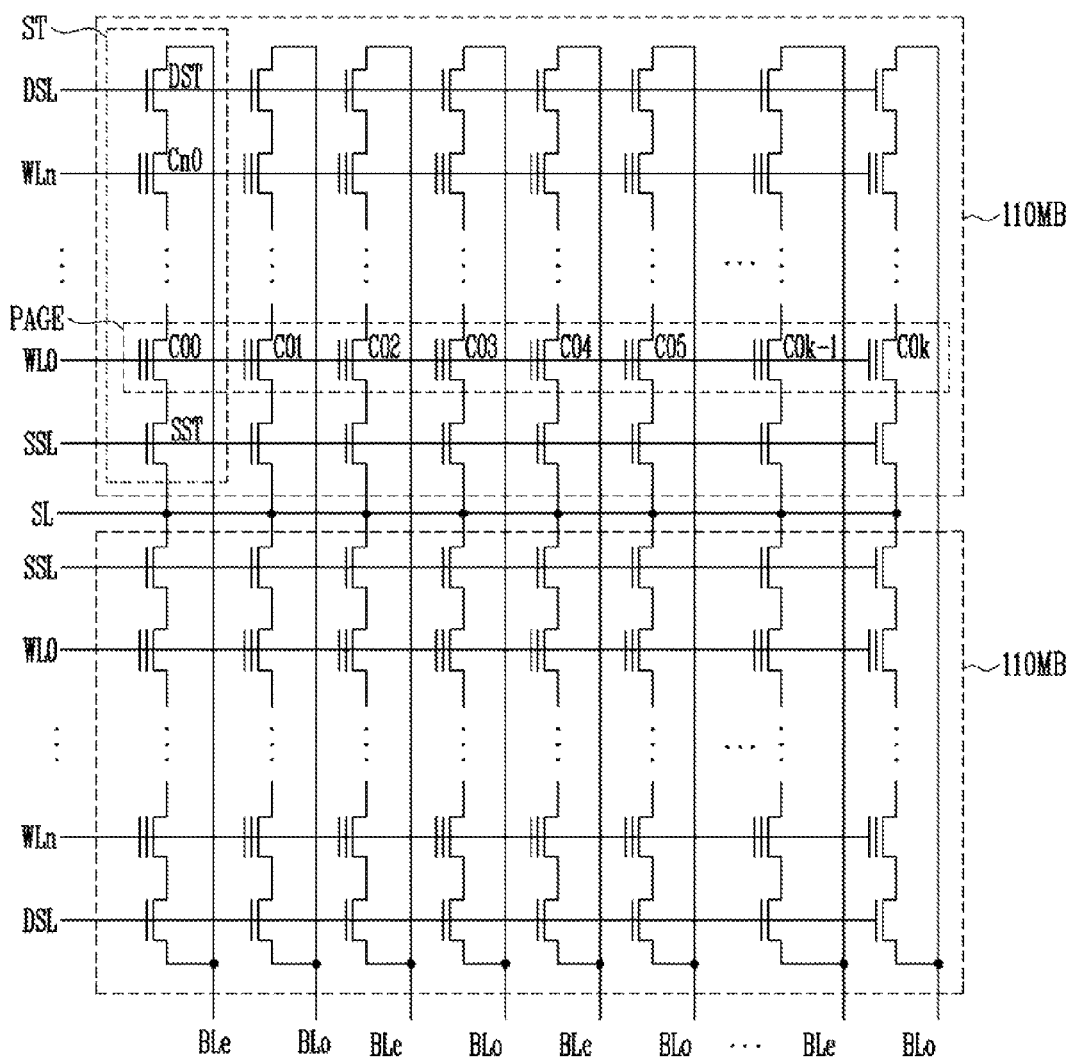
FIG. 2 is a detailed diagram for describing a memory block shown in FIG. 1.

FIG. 2 is a detailed diagram of the memory blocks 110 MB shown in FIG. 1.

Referring to FIG. 2, each memory block includes a plurality of memory strings ST connected between bit lines BLe and BLo and a common source line SL. That is, the memory strings ST are connected to the corresponding bit lines BLe to BLo, respectively, and are commonly connected to the common source line SL. Each memory string ST1 includes a source select transistor SST in which a source is connected to the common source line CSL, a plurality of cell strings serially connected with a plurality of memory cells C00 to Cn0, and a drain select transistor DST in which a drain is connected to the bit line BLe. The memory cells C00 to Cn0 included in the cell string are serially connected between the select transistors SST and DST. A gate of the source select transistor SST is connected to the source select line SSL, and gates of the memory cells C00 to Cn0 are connected to word lines WL0 to WLn, respectively, and a gate of the drain select transistor DST is connected to a drain select line DSL.

The drain select transistor DST controls a connection or a block between the cell string ST and the bit line BLe, and the source select transistor SST controls a connection or a block between the cell strings ST and the common source line SL.

The memory cells included in the memory cell block in a NAND flash memory device may be divided in units of a physical page or units of a logical page. For example, the memory cells C00 to C0k connected to one word line (for example, a word line WL0) configure one physical page PAGE. Further, even-numbered memory cells C00, C02, C04, and C0k−1 connected to one word line (for example, the word line WL0) configure an even page, and odd-numbered memory cells C01, C03, C05, and C0k connected to one word line (for example, the word line WL0) may form an odd page. The page (or the even page and the odd page) may be a basic unit of program operation and read operations.

Figure 3A:
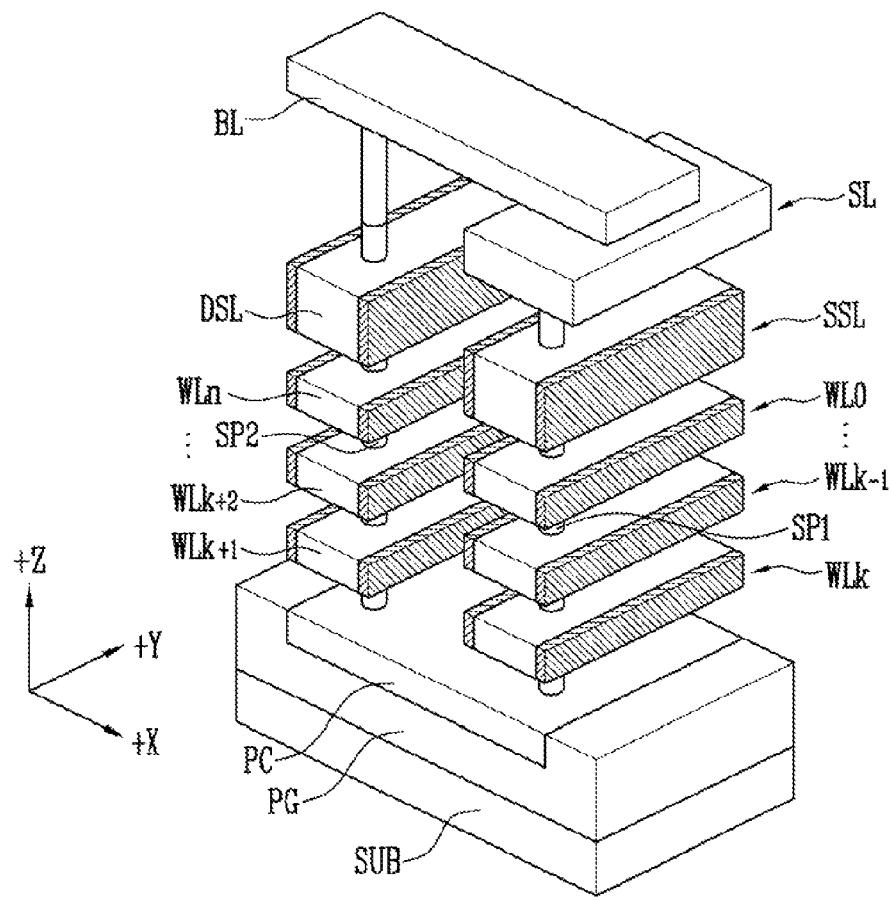
FIGS. 3A to 3C are diagrams for describing a memory block shown in FIG. 1.
Figure 3B:
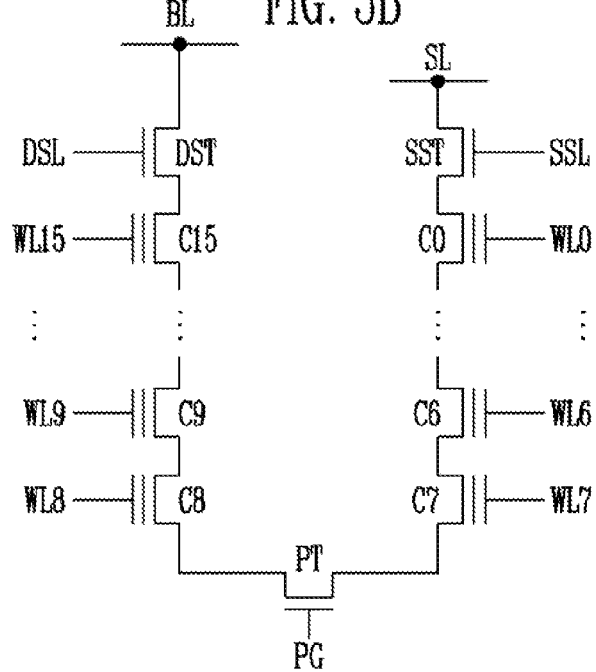
Figure 3C:
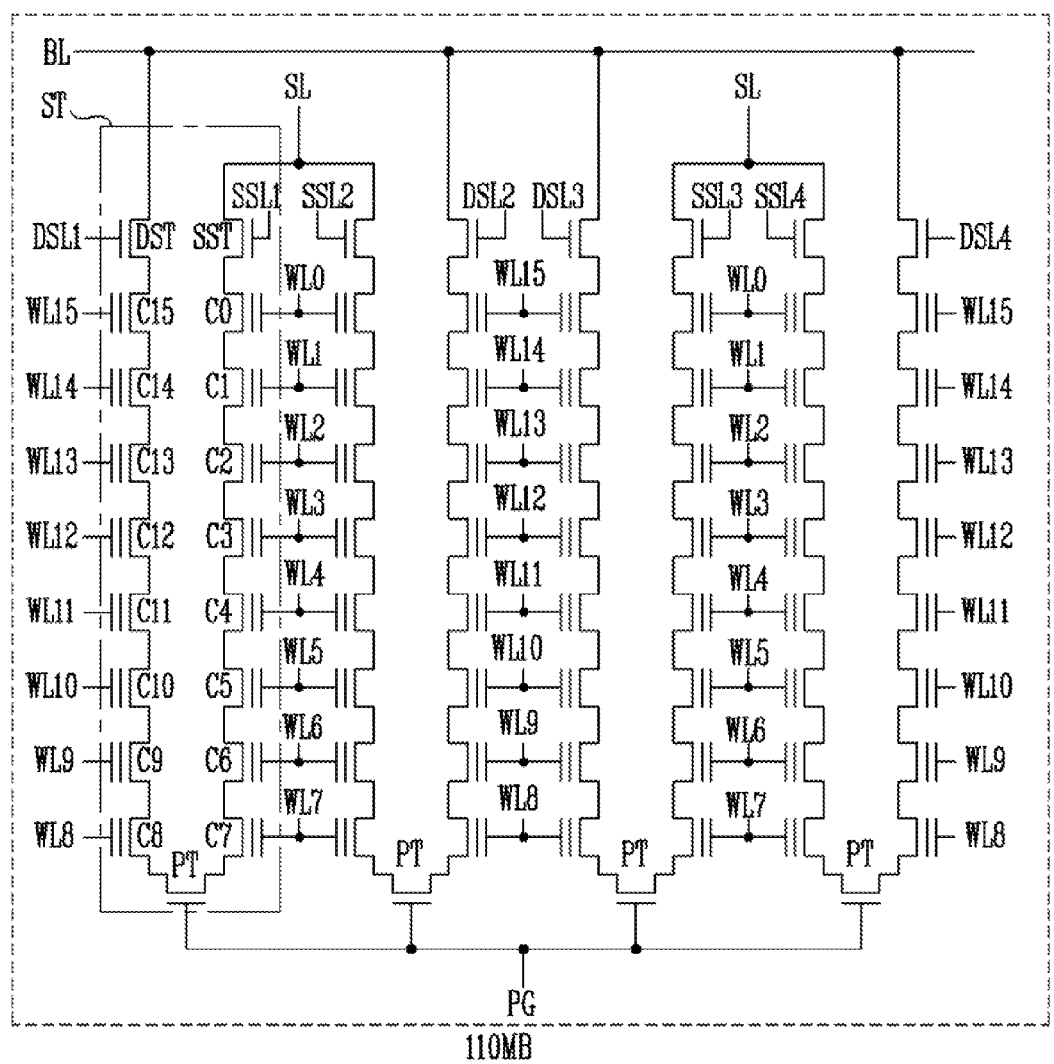

FIGS. 3A to 3C are diagrams for describing the memory blocks 110 MB shown in FIG. 1.

Referring to FIGS. 3A and 3B, a pipe gate PG including a recess portion is formed on a semiconductor substrate SUB, and a pipe channel layer PC is formed within the recess portion of the pipe gate PG. A plurality of vertical channel layers SP1 and SP2 is formed on the pipe channel layer PC. An upper part of a first vertical channel layer SP1 among a pair of vertical channel layers is connected with a common source line SL, and an upper part of a second vertical channel layer SP2 is connected with a bit line BL. The vertical channel layers SP1 and SP2 may be formed of polysilicon.

A plurality of conductive layers DSL, and WL15 to WL8 is formed to surround the second vertical channel layer SP2 at different heights of the second vertical channel layer SP2. Further, a plurality of conductive layers SSL, and WL- to WL7 is formed to surround the first vertical channel layer SP1 at different heights of the first vertical channel layer SP1. Multiple layers (not shown) including a charge storage layer are formed on surfaces of the vertical channel layers SP1 and SP2 and a surface of the pipe channel layer PC, and the multiple layers are also positioned between the vertical channel layers SP1 and SP2 and the conductive layers DSL, WL15 to WL8, SSL, and WL0 to WL7, and between the pipe channel layer PC and the pipe gate PG.

A topmost conductive layer surrounding the second vertical channel layer SP2 may be a drain select line DSL, and lower conductive layers of the drain select line DSL may be word lines WL15 to WL18. A topmost conductive layer surrounding the first vertical channel layer SP1 may be a source select line SSL, and lower conductive layers of the source select line SSL may be word lines WL0 to WL7. Some of the conductive layers used as word lines may be dummy word lines (not shown).

That is, the first conductive layers SSL, and WL0 to WL7 and the second conductive layers DSL, and WL15 to WL8 are stacked on different areas of the semiconductor substrate, respectively. The first vertical channel layer SP1 passing through the first conductive layers SSL, and WL0 to WL7 are vertically connected between the source line SL and the pipe channel layer PC. The second vertical channel layer SP2 passing through the second conductive layers DSL, and WL15 to WL8 are vertically connected between the bit line BL and the pipe channel layer PC.

A drain select transistor DST is formed where the drain select line DSL surrounds the second vertical channel layer SP2, and main cell transistors C15 to C8 are formed where the word lines WL15 to WL8 surround the second vertical layer SP2, respectively. A source select transistor SST is formed where the source select line SSL surrounds the first vertical channel layer SP1, and main cell transistors C0 to C7 are formed where the word lines WL0 to WL7 surround the first vertical layer SP1, respectively.

According to the aforementioned structure, the memory string may include the drain select transistor DST and the main cell transistors C15 to C8 vertically connected with the substrate between the bit line BL and the pipe channel layer PC, and the source select transistor SST and the main cell transistors C0 to C7 vertically connected with the substrate SUB between the common source line CSL and the pipe channel layer PC. In the above structure, a dummy cell transistor (not shown) may be further connected between the select transistor DST or SST and the main cell transistor C15 or C0, and a dummy cell transistor (not shown) may be further connected between the main cell transistor C8 or C7 and the pipe transistor PT.

The source select transistor SST and the main cell transistors C0 to C7 connected between the common source line SL and the pipe transistor PT may form a first vertical memory string, and the drain select transistor DST and the main cell transistors C15 to C8 connected between the bit line BL and the pipe transistor PT may form a second vertical memory string.

Referring to FIG. 3C, the memory block 110 MB includes the memory strings ST connected to the bit lines. The memory string ST in a U-shaped structure includes a first memory string SST, and C0 to C7 vertically connected between the common source line SL and the pipe transistor PT of the substrate, and a second memory string C8 to C15, and DST vertically connected between the bit line BL and the pipe transistor PT of the substrate. The first vertical memory string SST, and C0 to C7 includes the source select transistor SST and the memory cells C0 to C7. The source select transistor SST is controlled by a voltage applied to source select lines SSL1 to SSL4, and the memory cells C0 to C7 are controlled by a voltage applied to the stacked word lines WL0 to WL7. The second vertical memory string C8 to C15, and DST includes the drain select transistor DST and the memory cells C8 to C15. The drain select transistor DST is controlled by a voltage applied to drain select lines DSL1 to DSL4, and the memory cells C8 to C15 are controlled by a voltage applied to the stacked word lines WL8 to WL15.

When the memory block 110 MB is selected, the pipe transistor PT connected between the pair of memory cells C7 and C8 positioned at a center in the memory string having the U-shaped structure performs an operation of electrically connecting channel layers of the first vertical memory string SST, and C0 to C7 and channel layers of the second vertical memory string C8 to C15, and DST included in the selected memory block 110 MB.

In a memory block having a 2D structure, one memory string is connected to each bit line, and the drain select transistors of the memory block are simultaneously controlled by one drain select line, but in the memory block 110 MB having the 3D structure, the memory strings ST are commonly connected to each bit line BL. In the same memory block 110 MB, the number of memory strings ST commonly connected to one bit line BL and controlled by the same word lines may be changed depending on design.

The memory strings ST are connected to one bit line BL in parallel, so that to selectively connect one bit line BL and the memory strings ST, the drain select transistors DST are independently controlled by the select voltages applied to the drain select lines DSL1 to DSL4.

The memory cells C0 to C7 of the first vertical memory string SST, and C0 to C7 and the memory cells C8 to C15 of the second vertical memory strings C8 to C15, which are vertically connected, are controlled by operation voltages applied to the stacked word lines WL0 to WL7 and the stacked word lines WL8 to WL15. The word lines WL0 to WL15 are divided in units of memory blocks.

The select lines DSL1 to DSL4, and SSL1 to SSL4 and the word lines WL0 to WL15 become local lines of the memory block 110 MB. Particularly, the source select lines SSL1 to SSL4 and the word lines WL0 to WL7 may become local lines of the first vertical memory string, and the drain select lines DSL1 to DSL4 and the word lines WL8 to WL15 may become local lines of the second vertical memory string. Gates PG of the pipe transistors PT may be commonly connected with the memory block 110 MB.

The memory cells connected to the different bit lines and sharing the drain select line (for example, the drain select line DSL4) within the memory block 110 MB configure one page PAGE. The memory block 110 MB may be a basic unit of an erase loop, and the page PAGE may be a basic unit of a program operation and a read loop.

Referring back to FIGS. 1 and 2, operation circuits 120 to 160 are configured to perform a program loop, an erase loop, and a read operation of the memory cells (for example, the memory cells C00 to C0k) connected to the selected word line (for example, the word line WL0). The program loop includes a program operation and a program verification operation, and the erase loop includes an erase operation and an erase verification operation.

The operation circuits 120 to 160 may perform the program loop in an Increment Step Pulse Program (ISPP) manner. That is, the operation circuits 120 to 160 repeatedly perform the program operation and the verification operation until all of the threshold voltages of the memory cells C00 to C0k connected to the selected word line (for example, the word line WL0) reach a target level. That is, the operation circuits 120 to 160 may repeatedly perform the program operation for storing data and the verification operation for confirming the storage of the data until it is confirmed that data input from the outside is stored in the memory cells C00 to C0k of the selected word line (for example, the word line WL0).

The operation circuits 120 to 160 may increase a program voltage Vpgm applied to the selected word line by a predetermined step voltage whenever repeatedly performing the program operation. That is, the operation circuits 120 to 160 may apply the program voltage Vpgm, which is increased by the step voltage compared to the program voltage used in the previous program operation, to the selected word line WL0 when performing the program operation.

The operation circuits 120 to 160 may be configured to perform the program verification operation by using a plurality of different program verification voltages. For example, when data of two bits is stored in each unit cell, the operation circuits 120 to 160 may perform the program verification operation by using three verification voltages. Further, when data of three bits is stored in each unit cell, the operation circuits 120 to 160 may perform the program verification operation by using seven verification voltages.

The erase loop may also be performed by the same method as that of the program loop. However, the operation circuits 120 to 160 may increase an erase voltage Verase applied to a bulk (a substrate or a well area) by a predetermined step voltage whenever the erase operation is repeatedly performed.

To perform the program loop, the erase loop, and the read operation, the operation circuits 120 to 160 are configured to selectively output operation voltages Verase, Vpgm, Vupgm, Vread, Vpv, Vpass, Vdsl, Vssl, Vsl, and Vpg to the local lines SSLa, WL0 to WLn, and DSL of the selected memory block and the common source line SL, and control a precharge/discharge of the bit lines BLe and BLo or sense a current flow of the bit lines BLe and BLo. For example, the erase voltage Verase is applied to the substrate, on which the memory cells are formed, or a bulk (not shown) during the erase operation, the program voltage Vpgm is applied to the selected word line during the program operation, the read voltage Vread is applied to the selected word line during the read operation, and the verification voltage Vpv is applied to the selected word line during the verification operation. The pass voltage Vpass is applied from the selected word line to non-selected word lines during the program operation, the read operation, or the verification operation, the drain select voltage Vdsl is applied to the drain select line DSL, the source select voltage Vssl is applied to the source select line, and the source voltage Vsl is applied to the common source line SL. When the memory block is formed in the structure disclosed in FIG. 3, the pipe gate voltage Vpg is applied to the pipe gate PG.

In a NAND flash memory device, the operation circuits include a control circuit 120, a voltage supply circuit 130, a read/write circuit 150, a column selection circuit 150, and an input/output circuit 160.

The control circuit 120 outputs a voltage control signal CMDv for controlling the voltage supply circuit 130, so that the operation voltages Verase, Vpgm, Vupgm, Vread, Vpv, Vpass, Vdsl, Vssl, Vsl, and Vpg for performing the program loop, the erase loop, and the read operation are generated with desired levels in response to a command signal CMD input through the input/output circuit 160. Further, the control circuit 120 outputs control signals CMDpb for controlling read/write circuits (or page buffers PB) included in the read/write circuit 140 to perform the program loop, the erase loop, and the read operation. Further, when an address signal ADD is input in the control circuit 120, a column address signal CADD and a row address signal RADD are generated by the input address signal ADD and output from the control circuit 120.

The voltage supply circuit 130 generates the operation voltages Verase, Vpgm, Vupgm, Vread, Vpv, Vpass, Vdsl, Vssl, Vsl, and Vpg according to the program loop, the erase loop, and the read operation of the memory cells in response to the voltage control signal CMDv of the control circuit 120, and outputs the operation voltages to the local lines SSL, and WL0 to WLn, DSL and the common source line SL of the selected memory block in response to the row address signal RADD of the control circuit 120.

The voltage supply circuit 130 may include a voltage generating circuit 131 and a row decoder 133. The voltage generating circuit 131 generates the operation voltages Verase, Vpgm, Vupgm, Vread, Vpv, Vpass, Vdsl, Vssl, Vsl, and Vpg in response to the voltage control signal CMDv of the control circuit 120, and the row decoder 133 transmits the operation voltages to the local lines SSL, and WL0 to WLn, DSL and the common source line SL of the selected memory block among the memory blocks 110 MB in response to the row address signal RADD of the control circuit 120. Verification voltages Vpv1 to Vpv3, which are to be described below, may be included in a verification voltage Vpv output by the voltage supply circuit 130.

The read/write circuit 140 may include each of a plurality of read/write circuits (for example, page buffers PB) connected with the memory array 110 through the bit lines BLe and BLo. Particularly, the read/write circuits PB may be connected to the bit lines BL3 and BLo, respectively. That is, one read/write circuit PB may be connected to one bit line. Further, the read/write circuit PB may be connected to a pair of bit lines BL3 and BLo.

During the program operation, the read/write circuits PB may selectively precharge the bit lines BLe and BLo according to the PB control signal CMDpb of the control circuit 120 and data DATA to be stored in the memory cells. That is, during the program operation, the read/write circuits PB may selectively apply a program inhibition voltage (for example, a power voltage) and a program permission voltage (for example, a ground voltage) to the bit lines BLe and BLo. The threshold voltage of the memory cells connected to the precharged bit line (that is, the bit line, to which the program inhibition voltage is applied) does not change much even though the program voltage is applied. However, a threshold voltage of the memory cell connected to the discharged bit line (that is, the bit line, to which the program permission voltage is applied) may be increased by the program voltage.

During the verification operation or the read operation, the read/write circuits PB may precharge the bit lines BLe and BLo, and then sense a voltage change or currents of the bit lines BLe and BLo, and latch data read from the memory cell according to the PB control signal CMDpb of the control circuit 120.

The read/write circuits PB may output signals Dout[0:k], based on which a cell distribution including the memory cells may be confirmed according to the data (the threshold voltages of the memory cells confirmed during the verification operation) read from the memory cells during the read operation.

The column selection circuit 150 selects the read/write circuits PB included in the read/write circuit group 140 in response to the column address CADD output by the control circuit 120. That is, the column selection circuit 150 sequentially transmits the data to be stored in the memory cells to the read/write circuits PB in response to the column address CADD. Further, the column selection circuit 150 sequentially selects the read/write circuits PB in response to the column address CADD, so that the data of the memory cells latched in the read/write circuits PB may be output to the outside by the read operation.

The input/output circuit 160 transmits the command signal CMD and the address signal ADD input from the outside to the control circuit 120. Further, the input/output circuit 160 may perform an operation of transmitting the data DATA input from the outside to the column selection circuit 150 during the program operation, or an operation of outputting the data read from the memory cells to the outside during the read operation.

The check circuit 170 may count and compare the number of memory cells divided by the read operations of the operation circuits 120 to 160. That is, the check circuit 170 may be configured to perform an operation of comparing the number of memory cells included in each cell distribution. To this end, the check circuit 170 may include a counter 171 and a comparator 172.

The counter 171 may count the number of memory cells divided according to the data read by the read operation. Further, the counter 171 may count the number of memory cells, which have higher threshold voltages than the read voltage applied during the read operation, and the number of remaining memory cells. Further, the counter 171 may count the number of memory cells included in each cell distribution.

The comparator 172 may compare the numbers of the memory cells counted by the counter 171. The comparator 172 may output a comparison result signal CHECH to the operation circuits 120 to 160 (particularly, the control circuit).

The operation circuits 120 to 160 perform the read operation of dividing the selected cell distribution into two cell distributions and confirming the memory cells included in each cell distribution. The check circuit 170 performs an operation of comparing the number of memory cells included in each cell distribution. As a result of the comparison by the check circuit 170, the operation circuits 120 to 160 may select the cell distribution including the least number of memory cells and re-perform the read operation.

The operation circuits 120 to 160 and the check circuit 170 may repeatedly perform the read operation and the operation of comparing the number of memory cells until the number of memory cells included in the selected cell distribution is less than a reference value. Information on the read voltage applied to the memory cells during the read operation last performed by the operation circuits 120 to 160 may be stored in a cam block.

Hereinafter, a method of operating the semiconductor device including the aforementioned configurations will be described. FIG. 4 is a flowchart for describing an operation of the semiconductor device shown in FIG. 1. FIG. 5 is a distribution diagram for describing an operation of the semiconductor device shown in FIG. 1.

Referring to FIGS. 1, 4, and 5, threshold voltages of the memory cells are distributed at different levels (for example, PV1 and PV2) according to the data stored in the memory cells. When an overlap region of the levels PV1 and PV2 of the adjacent threshold voltages is increased, or the levels PV1 and PV2 of the threshold voltages are changed to a high level or a low level, data read from the memory cells may be changed. That is, the number of error bits included in the data of the memory cells is increased. Accordingly, the read voltage applied during the read operation needs to be changed. A method of searching for an optimum read voltage will be described below.

In operation S410, the operation circuits 120 to 160 perform a read operation of the memory cells. Particularly, the operation circuits 120 to 160 perform the read operation of dividing a selected cell distribution into two cell distributions A and B and confirming the memory cells included in each cell distribution A and B.

For example, the operation circuits 120 to 160 may use three read voltages VR1, VR2, and VR3 for the read operation. First, the operation circuits 120 to 160 confirms the memory cells included in the first cell distribution A through the read operation using the first read voltage VR1 and the second read voltage VR2, and confirms the memory cells included in the second cell distribution B through the read operation using the second read voltage VR2 and the third read voltage VR3. That is, the operation circuits 120 to 160 latches a result of the read operation using the first read voltage VR1, latches a result of the read operation using the second read voltage VR2, and latches a result of the read operation using the third read voltage VR3. It is possible to confirm the memory cells included in the first cell distribution A and the second cell distribution B by using the latched results. A threshold voltage of the memory cells included in the first cell distribution A is higher than the first read voltage VR1 and is lower than the second read voltage VR2. A threshold voltage of the memory cell included in the second cell distribution B is higher than the second read voltage VR2 and is lower than the third read voltage VR3.

In operation S420, the check circuit 170 counts and compares the number of memory cells divided by the read operation. The counter 171 of the check circuit 170 may count the number of memory cells included in the first cell distribution A, and count the number of memory cells included in the second cell distribution B according to the data read by the read operation. That is, the counter 171 of the check circuit 170 may count the number of memory cells having lower threshold voltages included in the first cell distribution A, and count the number of memory cells having higher threshold voltages included in the second cell distribution B according to differences between the read voltages obtained through the read operation and the threshold voltage.

In operation S430, the comparator 172 of the check circuit 170 compares the number of memory cells included in the first cell distribution A and the number of memory cells included in the second cell distribution B. That is, the comparator 172 of the check circuit 170 compares the number of memory cells having lower threshold voltages with the number of memory cells having higher threshold voltages. Then, the comparator 172 of the check circuit 170 outputs a comparison result signal CHECK to the operation circuits 120 to 160 (particularly, the control circuit 120).

When the number of memory cells having the lower threshold voltages is greater than the number of memory cells having the higher threshold voltages according to the comparison result signal CHECK, a next operation is performed. In operation S440, the operation circuits 120 to 160 select a read voltage VR4 corresponding to an intermediate level in the cell distribution B having the higher threshold voltages.

In operation S460, the operation circuits 120 to 160 determine whether to additionally perform the read operation. For example, when the number of memory cells included in the cell distribution B having the higher threshold voltages is greater than a reference value, the operation circuits 120 to 160 may determine whether to additionally perform the read operation. The determination may be performed by the control circuit 120.

When it is determined whether to additionally perform the read operation, the operation circuits 120 to 160 performs the read operation using the read voltage VR4 selected in operation S440. The cell distribution B may be divided into two cell distributions C and D by the read voltage VR4, and the memory cells included in the cell distribution C and the memory cells included in the cell distribution D among the memory cells included in the cell distribution B may be confirmed by the read operation.

For example, the operation circuits 120 to 160 may confirm the memory cells, of which the threshold voltages are lower than the fourth read voltage VR4 and included in the cell distribution C and the memory cells, of which the threshold voltages are higher than the fourth read voltage VR4 and included in the cell distribution D among the memory cells included in the cell distribution B through the read operation using the fourth read voltage VR4. That is, the operation circuits 120 to 160 latch a result of the read operation using the fourth read voltage VR4. It is possible to confirm the memory cells included in the cell distribution C and the cell distribution D according to the results latched in the read operation using the second, third, and fourth read voltages VR2, VR3, and VR4. The threshold voltage of the memory cell included in the cell distribution C is higher than the second read voltage VR2 and is lower than the fourth read voltage VR4. The threshold voltage of the memory cells included in the cell distribution D is higher than the fourth read voltage VR4 and is lower than the third read voltage VR3.

Next, in operation S420, the check circuit 170 counts and compares the number of memory cells divided according to the read operation of operation S470 using the fourth read voltage VR4. The counter 171 of the check circuit 170 may count the number of memory cells included in the third cell distribution C, and count the number of memory cells included in the fourth cell distribution D according to the data read by the read operation. That is, the counter 171 of the check circuit 170 may count the number of memory cells having lower threshold voltages included in the third cell distribution C, and count the number of memory cells having higher threshold voltages included in the fourth cell distribution D according to differences between the read voltages obtained through the read operation and the threshold voltage.

In operation S430, the comparator 172 of the check circuit 170 compares the number of memory cells included in the third cell distribution C and the number of memory cells included in the fourth cell distribution D. That is, the comparator 172 of the check circuit 170 compares the number of memory cells having lower threshold voltages with the number of memory cells having higher threshold voltages. Then, the comparator 172 of the check circuit 170 outputs a comparison result signal CHECK to the operation circuits 120 to 160 (particularly, the control circuit 120).

When the number of memory cells having the higher threshold voltages is greater than the number of memory cells having the lower threshold voltages according to the comparison result signal CHECK, the next operation is performed. In operation S450, the operation circuits 120 to 160 select a read voltage VR5 corresponding to an intermediate level in the low cell distribution C. The cell distribution C may be divided into two cell distributions E and F by the read voltage VR5.

In operation S460, the operation circuits 120 to 160 determine whether to perform an additional read operation. As a result of the determination, operations S470, S420, and S430 may be performed, and one operation (for example, operation S450) among the operations S440 and S450 may be performed. As a result, a read voltage VR6 may be determined.

In operation S460, when the number of memory cells included in the cell distribution E is less than a reference value, the operation circuits 120 to 160 may determine to not perform an additional read operation. In this case, in operation S480, the read voltage VR6 is finally determined as the read voltage to be used in the read operation. Further, the operation circuits 120 to 160 may store information on the read voltage VR6 in the memory block used as a cam block.

When the read voltage is changed through the operation, it is possible to recognize a level PV1 or PV2, to which the threshold voltage of the memory cell belongs, thereby improving reliability of the read operation.

Figure 6:
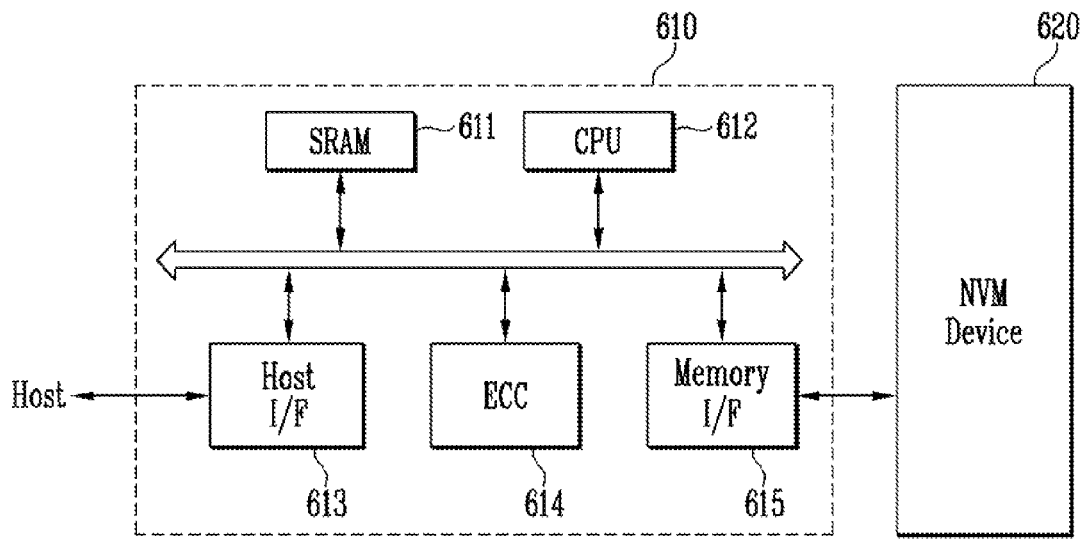
FIG. 6 is a block diagram illustrating a memory system according to an embodiment of the present invention.

FIG. 6 is a block diagram illustrating a memory system 600 according to an embodiment of the present invention.

Referring to FIG. 6, the memory system 600 may include a nonvolatile memory device 620 and a memory controller 610.

The nonvolatile memory device 620 may correspond to the semiconductor device described with reference to FIGS.

1 to 5, and may be connected to the memory array and the operation circuits as described with reference to FIG. 1. The memory controller 610 may control the nonvolatile memory device 620. A memory card or a semiconductor disk device (e.g., Solid State Disk: SSD) may be provided by a combination of the nonvolatile memory device 620 and the memory controller 610. An SRAM 611 is used as an operation memory of a processing unit 612. A host interface 613 includes a data exchange protocol of a host connected with the memory system 600. An error correction block 614 detects and corrects an error included in the data read from a cell region of the nonvolatile memory device 620. A memory interface 614 interfaces with the nonvolatile memory device 620. The processing unit 612 performs general control operations for data exchange of the memory controller 610.

Although it is not illustrated in the drawings, the memory system 600 may further include a ROM (not shown) storing code data for interfacing with the host. The nonvolatile memory device 620 may also be provided in the form of a multi-chip package including a plurality of flash memory chips. The memory system 600 may be provided as a highly reliable storage medium with improved operation characteristics. A flash memory device may be included in a memory system, such as a semiconductor disk device (e.g., an SSD) actively studied in recent days. In this case, the memory controller 610 may communicate with an external device (for example, the host) through one of various interface protocols, such as USB, MMC, PCI-E, SATA, PATA, SCSI, ESDI, and IDE.

Figure 7:
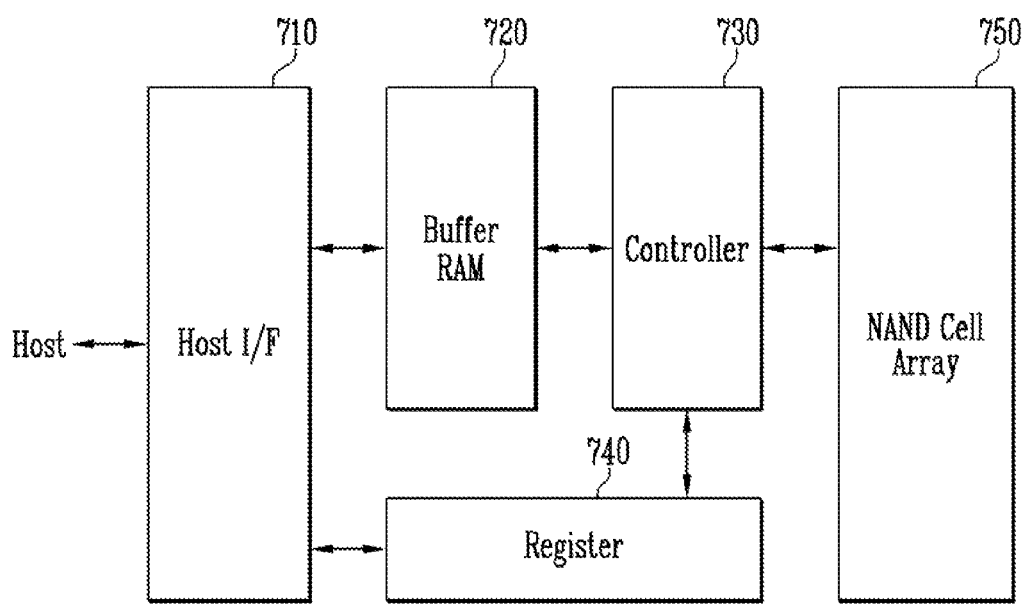
FIG. 7 is a block diagram illustrating a fusion memory device or a fusion memory system according to an embodiment of the present invention.

FIG. 7 is a block diagram illustrating a fusion memory device or a fusion memory system according to an embodiment of the present invention. For example, the technical characteristics of an embodiment of the present invention may be applied a OneNAND flash memory device 700 as a fusion memory device.

The OneNAND flash memory device 700 may include a host interface 710 for exchanging various information with a device using different protocols, a buffer RAM 720 including a code for driving the memory device, or temporally storing data, a controller 730 configured to control a read operation, a program operation, and all states in response to a control signal and a command provided from the outside, a register 740 storing data, such as a command, an address, and configurations defining a system operating environment within the memory device, and a NAND flash cell array 750 formed of the operation circuit including a nonvolatile memory cell and a page buffer. The OneNAND flash memory device programs the data in response to a write request from the host by a general method.

Figure 8:
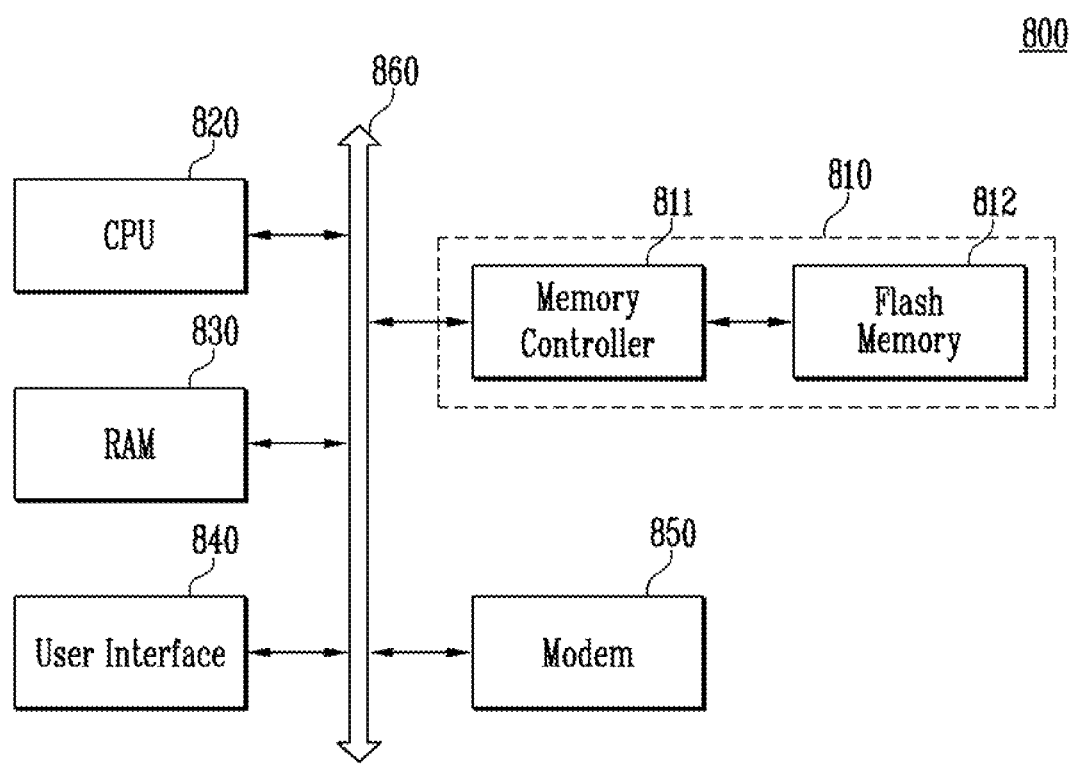
FIG. 8 is a block diagram illustrating a computing system according to an embodiment of the present invention.

FIG. 8 illustrates a computing system 800 according to an embodiment of the present invention, which includes a flash memory device 812.

The computing system 800 may include a microprocessor 820, a RAM 830, a user interface 840, a modem 850, such as a baseband chipset, and a memory system 810 electrically connected to a system bus 860. When the computing system 800 is a mobile device, a battery (not shown) for supplying an operating voltage of the computing system 800 may be further provided. Although it is not illustrated in the drawings, the computing system 800 may further include an application chipset, a Camera Image Processor, a mobile DRAM, and the like, which is apparent to those skilled in the art. The memory system 810 may form, for example, an SSD using the semiconductor memory described with reference to FIGS. 1 to 5 to store data. Otherwise, the memory system 810 may be provided as a fusion flash memory (for example, a OneNAND flash memory).

Embodiments have been disclosed in the drawings and the specification. The specific terms used herein are for illustration, and do not limit the scope of the present invention as defined in the claims. Accordingly, those skilled in the art will appreciate that various modifications and equivalent examples may be made without departing from the scope and spirit of the present disclosure. Therefore, the sole technical protection scope of the present invention will be defined by the technical spirit of the accompanying claims.

What is claimed is:

1. A semiconductor device, comprising:
   memory cells;
   an operation circuit suitable for performing a first read operation using a first read voltage on the memory cells included in a cell distribution, the first read operation dividing the cell distribution into a first cell distribution and a second cell distribution based on the first read voltage; and
   a check circuit suitable for comparing the number of memory cells included in the first cell distribution and the number of memory cells included in the second cell distribution,
   wherein the operation circuit selects a second read voltage based on a result of the comparison, and performs a second read operation using the second read voltage on the memory cells, and
   wherein, when the result of the comparison indicates the number of memory cells included in the first cell distribution being greater than the number of memory cells included in the second cell distribution, the second read operation divides the second cell distribution into two cell distributions based on the second read voltage.

2. The semiconductor device of claim 1, wherein the check circuit includes:
   a counter suitable for counting memory cells divided according to data read by the read operation; and
   a comparator suitable for comparing the counted numbers of memory cells.

3. The semiconductor device of claim 1, wherein the check circuit includes:
   a counter suitable for counting memory cells included in the first cell distribution and memory cells included in the second cell distribution; and
   a comparator suitable for comparing the counted numbers of memory cells.

4. The semiconductor device of claim 1, wherein the operation circuits perform first the first read operation using the first read voltage and a third read voltage to confirm the first cell distribution and using the third read voltage and a fourth read voltage to confirm the second cell distribution.

5. The semiconductor device of claim 4, wherein the check circuit counts memory cells, of which threshold voltages are higher than first read voltage and are lower than the first read voltage, and counts memory cells, of which threshold voltages are higher than the first read voltage and are lower than the fourth read voltage.

6. The semiconductor device of claim 4, wherein, when less memory cells are included in the second cell distribution than the first cell distribution, the operation circuit performs the second read operation using the second read voltage corresponding to an intermediate voltage of the first and fourth read voltages, and
   wherein, when less memory cells are included in the first cell distribution than the second cell distribution, the operation circuit performs the second read operation using the second read voltage corresponding to an intermediate voltage of the first and third read voltages.

7. The semiconductor device of claim 1, wherein the operation circuit performs the first read operation to confirm memory cells included in the first cell distribution and memory cells included in the second cell distribution, by using three read voltages including the first read voltage.

8. The semiconductor device of claim 7, wherein the check circuit compares the number of memory cells included in the first cell distribution and the number of memory cells included in the second cell distribution.

9. The semiconductor device of claim 8, wherein the operation circuit performs the second read operation using the second read voltage, based on which cell distribution having the less number of memory cells is divided into two cell distributions, based on the result of the comparison.

10. The semiconductor device of claim 9, wherein the operation circuit and the check circuit repeatedly perform a read operation and an operation of comparing the number of memory cells and a reference value until the number of memory cells included in a cell distribution is less than the reference value.

11. A semiconductor device, comprising:
   memory cells;
   an operation circuit suitable for dividing a selected cell distribution into first and second cell distributions by performing a read operation to confirm memory cells included in each cell distribution of the first and second cell distributions; and
   a check circuit suitable for comparing the number of memory cells included in the first cell distribution and the number of memory cells included in the second cell distribution,
   wherein the operation circuit selects one cell distribution among the first and second cell distributions and re-performs the read operation dividing the selected cell distribution into a third and fourth cell distributions, based on a result of the comparison, and
   wherein the selected cell distribution includes the number of memory cells less than an unselected cell distribution among the first and second cell distributions.

12. The semiconductor device of claim 11, wherein the check circuit includes:
   a counter suitable for counting memory cells included in the respective cell distributions; and
   a comparator suitable for comparing the counted numbers of memory cells.

13. The semiconductor device of claim 11, wherein the operation circuit selects a cell distribution having less memory cells among the third and fourth cell distributions and re-performs the read operation dividing the selected cell distribution among the third and fourth cell distributions into two cell distributions.

14. The semiconductor device of claim 11, wherein the operation circuit and the check circuit repeatedly perform the read operation and an operation of comparing the number of memory cells and a reference value until the number of memory cells included in the selected cell distribution is less than the reference value.

15. The semiconductor device of claim 14, wherein information on a read voltage applied during a read operation in which the number of memory cells included in the selected cell distribution is less than the reference value is stored.

* * * * *